United States Patent
Chen et al.

(10) Patent No.: US 7,615,706 B2
(45) Date of Patent: Nov. 10, 2009

(54) LAYOUT OF A PRINTED CIRCUIT BOARD

(75) Inventors: Cheng-Hsin Chen, Yuanlin Township (TW); Kuang-Cheng Kao, Taipei (TW); Chen-Yu Yang, Keelung (TW)

(73) Assignee: TPO Displays Corp., Chu-Nan (TW)

( * ) Notice: Subject to any disclaimer, the term of this patent is extended or adjusted under 35 U.S.C. 154(b) by 0 days.

(21) Appl. No.: 11/508,057

(22) Filed: Aug. 21, 2006

(65) Prior Publication Data

US 2008/0041616 A1    Feb. 21, 2008

(51) Int. Cl.
    *H05K 1/16* (2006.01)
(52) U.S. Cl. ........................................ 174/260
(58) Field of Classification Search .............. 174/260, 174/254; 257/668
    See application file for complete search history.

(56) References Cited

U.S. PATENT DOCUMENTS 5,339,217 A * 8/1994 Cohen et al. ............... 361/707
6,903,369 B2   6/2005 Chen et al.
2004/0051829 A1 * 3/2004 Ishihara et al. ............. 349/114
2004/0084761 A1 * 5/2004 Karthikeyan et al. ........ 257/700
2005/0124093 A1 * 6/2005 Yang et al. .................. 438/110

FOREIGN PATENT DOCUMENTS

CN    2532661    1/2003

* cited by examiner

*Primary Examiner*—Dean A. Reichard
*Assistant Examiner*—Abiy Getachew
(74) *Attorney, Agent, or Firm*—Liu & Liu

(57) ABSTRACT

A layout of a printed circuit board adaptive to be bonded to an integrated circuit device is introduced here. The layout includes a first metal layer, disposed in a first insulation layer and a second metal layer, disposed in a second insulation layer over the first insulation layer. The first metal layer and the second metal layer are connected to each other through a plurality of contact hole filled with conductive materials and are arranged to be substantially parallel to each other throughout a pad structure region and a line structure region of the printed circuit. The connected first metal layer and second metal layer are used for a signal path from the printed circuit board to the bonded integrated circuit device to improve driving ability of power supply.

13 Claims, 4 Drawing Sheets

LAYOUT OF A PRINTED CIRCUIT BOARD

BACKGROUND OF THE INVENTION

1. Field of Invention

The present invention relates to a layout for enhancing driving ability of a signal path from a printed circuit board to an bonded integrated circuit. More particularly, the present invention relates to a layout of a signal path from a printed circuit board to a bonded integrated circuit, which by reducing capacitance of the layout to improve driving ability of the integrated circuit.

2. Description of Related Art

Chip-on-Glass (COG) product needs different power supplies for providing power sources to circuits integrated in the COG product. However, for scaling down a size of the integrated circuits (ICs), the scale-down layouts of the IC cause the width of power line structures being not wide enough to provide enough driving ability or being damaged. For example, FIG. 1 shows a layout of a COG product, which includes a power supply portion 110 and a circuit portion 120 bonding thereon. If some damages occurs in one of the line structures, as denoted as "112", for example, and the damaged line structure is used for supplying power source to the circuit portion 120, it will cause the failure of the power supply.

In other case, if the width of the line structure is restricted and can not be wide enough for providing sufficient driving ability, it will also cause the power supplying failed. As shown in FIG. 1, if the line structures are used for providing a gamma driving reference voltage (GVDD), a gate driver power supply voltage (VGH), or a source driver power supply voltage (AVDD) and the like for a display, the driving ability of the line structures is an important issue for the display. If the width of the power line is too small, for example, 11 um, some yield loss will occur because of the shortage of driving ability of the power line.

SUMMARY OF THE INVENTION

A new architecture to improve driving ability of signal path from a printed circuit board to a bonded IC device is proposed here.

In one embodiment, a layout of a printed circuit board adaptive to be bonded to an integrated circuit device is introduced here. The layout includes a first metal layer, disposed in a first insulation layer and a second metal layer, disposed in a second insulation layer over the first insulation layer. The first metal layer and the second metal layer are connected to each other through a plurality of contact hole filled with conductive materials and are arranged to be substantially parallel to each other throughout a pad structure region and a line structure region of the printed circuit. The connected first metal layer and second metal layer are used for a signal path from the printed circuit board to the bonded integrated circuit device.

In the above-mentioned layout of the printed circuit board, the printed circuit board is a flexible printed circuit board.

In the above-mentioned layout of the printed circuit board, the conductive materials of the contact hole are the same material of the second metal layer.

In the above-mentioned layout of the printed circuit board, further includes a gate insulation layer, wherein the first metal layer is disposed on the gate insulation layer.

In the above-mentioned layout of the printed circuit board, in the pad structure region, the second metal layer is exposed and an Indium Tin Oxide (ITO) layer is disposed on the second metal layer.

In the above-mentioned layout of the printed circuit board, the first insulation layer is an inter-layer dielectric layer.

In the above-mentioned layout of the printed circuit board, the second insulation layer is a planarization layer.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
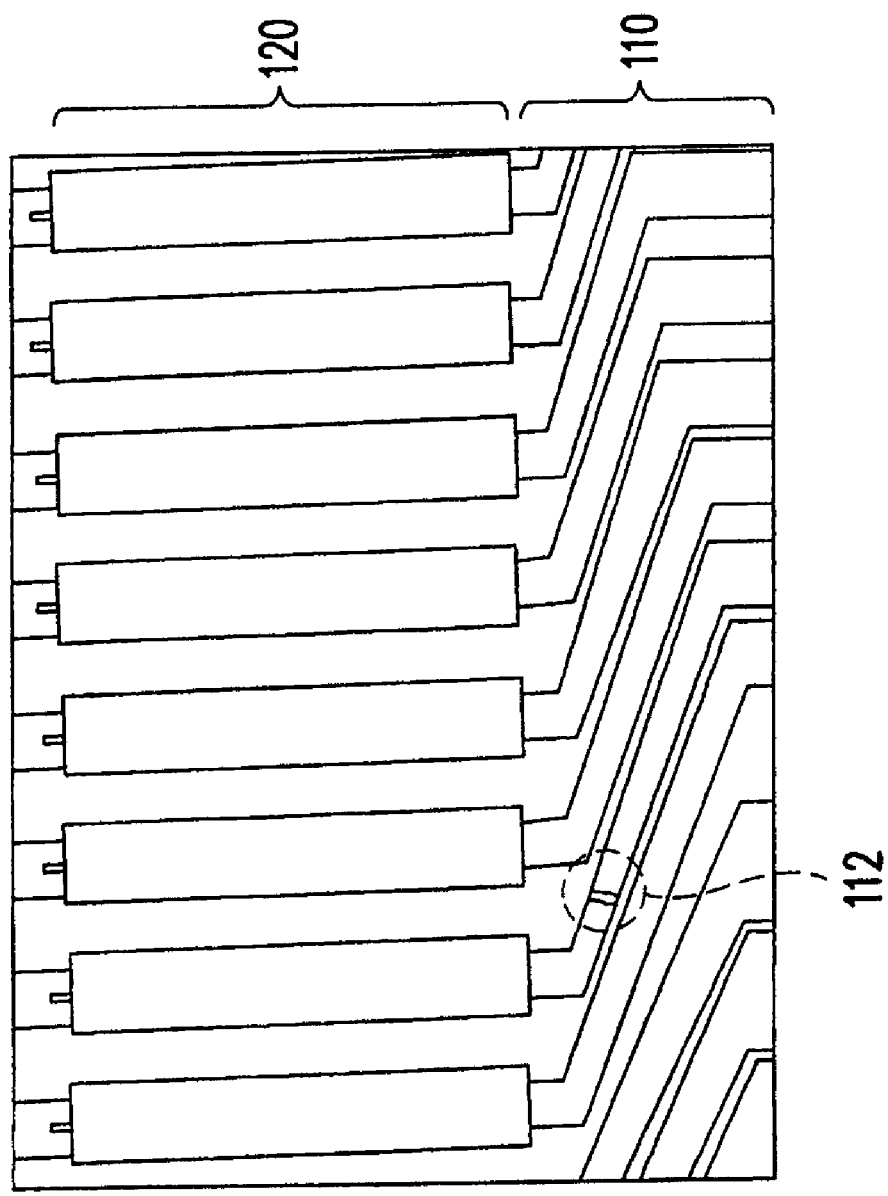
FIG. 1 is a schematic block diagram of a layout of a COG product, which includes a power supply portion and a circuit portion bonding thereon.
Figures 2A, 2B:
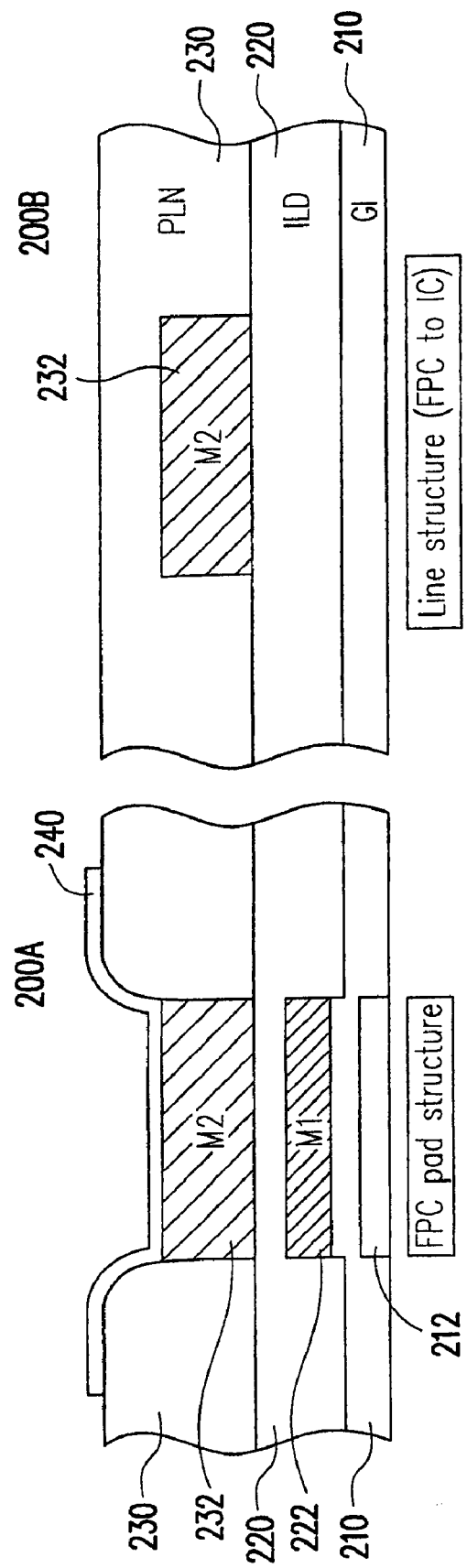
FIG. 2A and FIG. 2B respectively show cross-sectional views of conventional layout structures of a FPC (Flexible Printed Circuit) board including at least a pad structure 200A and a line structure portion 200B.

Please refer to FIG. 2A and FIG. 2B, which respectively show cross-sectional views of conventional layout structures of a FPC (Flexible Printed Circuit) board including at least a pad structure 200A and a line structure portion 200B. As known in the art, the FPC board has a plurality of the pad structures and the line structures as desired. The FPC pad structure 200A includes a first metal layer 222 and a second metal layer 232 formed between a plurality of stacked insulation layers. As shown in FIG. 2A, the first metal layer 222, which is known as "metal 1 layer" and denoted as "M1", is covered by an inter-layer dielectric (ILD) layer 220 within the pad structure region 212 and formed on an gate insulation (GI) layer 210. The second metal layer 232 (which is known as "metal 2 layer" and denoted as "M2") formed in a planarization (PLN) layer 230. The FPC pad structure 200A further includes a Indium Tin Oxide (ITO) layer 240 over the second metal layer 232. The line structure portion 200B includes a line structure which is the patterned second metal layer (M2) 232 coupled to power supply for providing power.

When the FPC board bonded to bonding pads of an integrated circuit device, for example, a driver. The signal path from the power supply to the connected IC device is through the second metal line (M2) 232, instead of the first metal line 222. If the width of the second metal line (M2) 232 is restricted to a limited value for scaling-down design, it will causes some problem in the driving ability. To avoid such problem, a new architecture to improve the driving ability of the line structure from the FPC board to the bonded IC device is proposed in the invention.

Figure 3A:
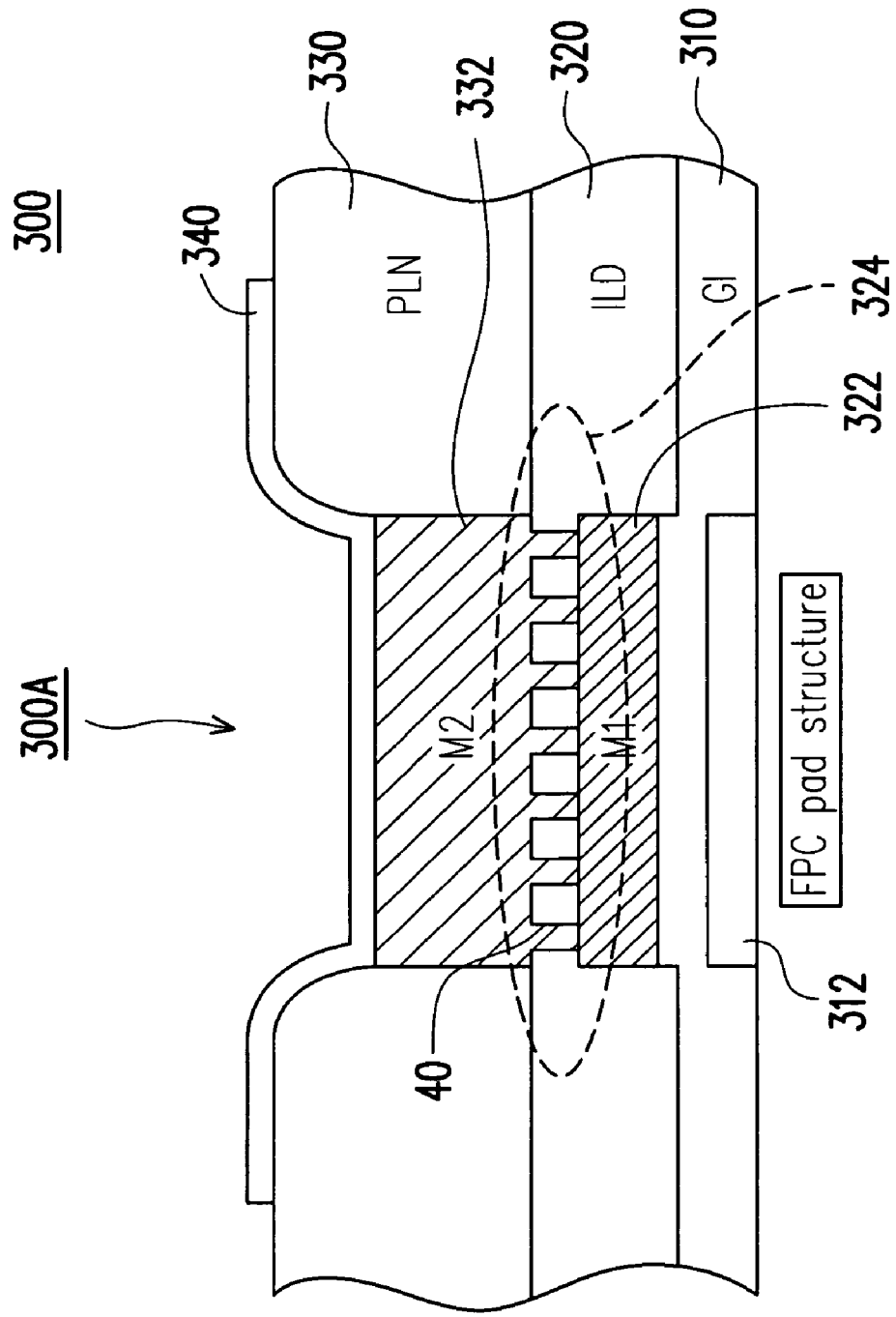
FIG. 3A and FIG. 3B respectively show cross-sectional views of a preferred embodiment of a layout structure of a printed circuit board.
Figure 3B:
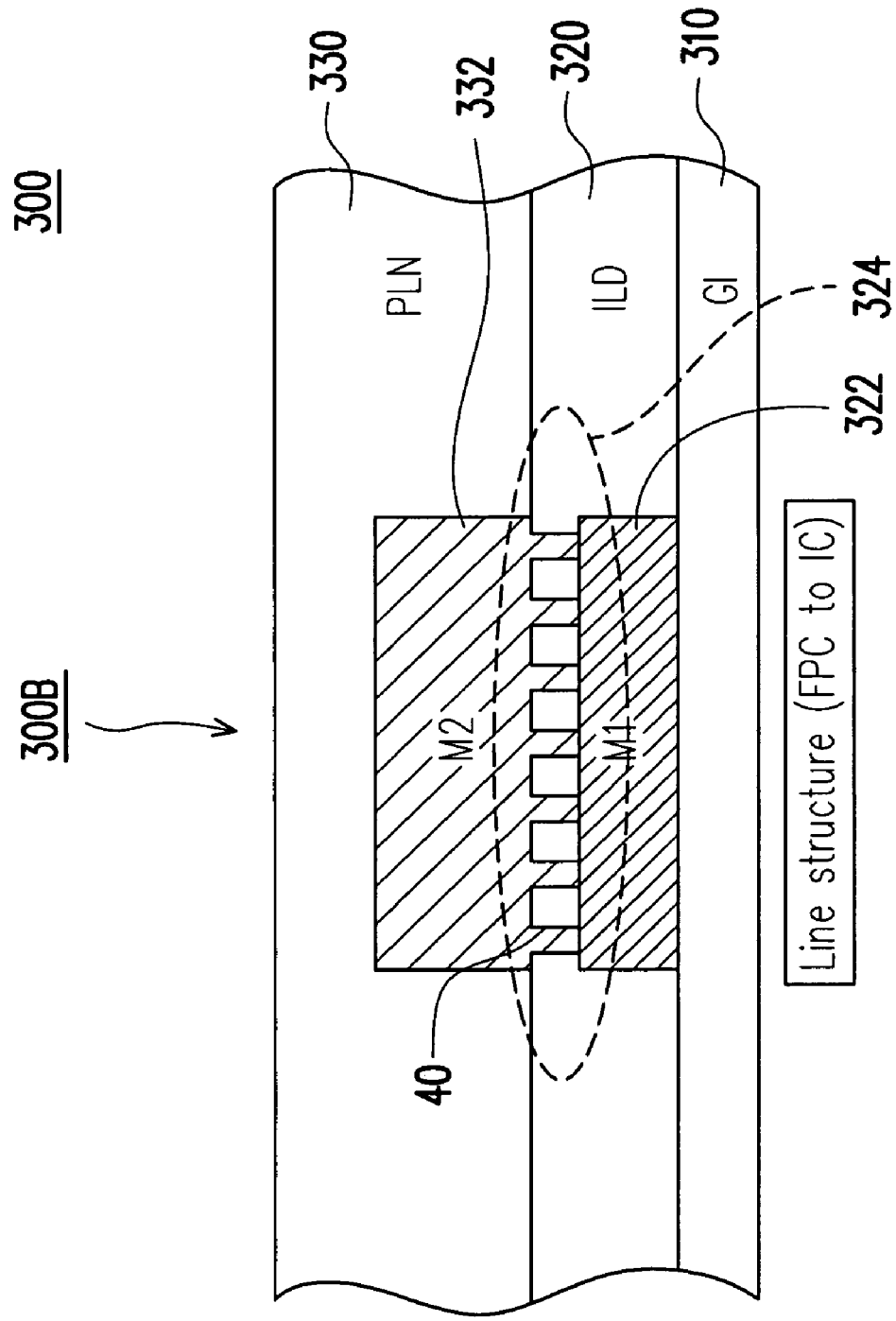

Please refer to FIG. 3A and FIG. 3B, which respectively show cross-sectional views of a preferred embodiment of a layout structure of a printed circuit board 300, for example, a flexible printed circuit (FPC) board. The FPC board 300 including at least a pad structure 300A and a line structure portion 300B. The FPC board 300 has a plurality of the pad structures for bonding to integrated circuit devices as desired and a plurality of line structures for providing power supply to the bonded integrated circuit devices. However, for explanation, one pad structure 300A and one line structure portion 300B is introduced here for the embodiment.

In FIG. 3A, the FPC pad structure 300A includes a first metal layer 322 and a second metal layer 332 formed between a plurality of stacked insulation layers. The first metal layer 322, which is known as "metal 1 layer" and denoted as "M1", is made of, for example, Mo materials. The first metal layer 322 is covered by an inter-layer dielectric (ILD) layer 320 and formed on a gate insulation (GI) layer 310, but not limited to be formed only within the pad structure region 312. The second metal layer 332 (which is known as "metal 2 layer" and denoted as "M2") is made of Mo/Al/Mo stacked materials and formed in a planarization (PLN) layer 330. The FPC pad structure 300A further includes an Indium Tin Oxide (ITO) layer 340 over the second metal layer 332.

The line structure portion 300B includes a line structure which is the patterned second metal layer (M2) 332 coupled to power supply for providing power. The first metal layer 322 and the second metal layer 332 are arranged to be electrically coupled to each other and laid out to be parallel to each other throughout the signal path from the FPC board 300 to the bonded integrated circuit devices. That is, in the region other than the pad structure region 312, the first metal layer 322 and the second metal layer 332 are electrically coupled to each other through a plurality of contact holes filled with the same materials as the second metal layer 332. The process is as follows. A first metal layer 322 is formed on the gate insulation (GI) layer 310. Then, an ILD layer 320 is formed on the first metal layer 322. Then, the ILD layer 320 is patterned, for example, by a photolithography process with a mask to form contact holes 40 to expose portions of the first metal layer 322. Then, a second metal layer 332 is formed on the ILD layer 320 and is also filled in the contact holes 40. That is, no further materials are required to fill in the contact holes 40.

It is assumed that the resistance of the first metal layer 322 is R1 and the resistance of the second metal layer 332 is R2. From theoretical point of view, if the signal path from the FPC board 300 to the bonded integrated circuit devices is only through the second metal layer 332, the resistance R of the signal path is R2. However, if the if the signal path from the FPC board 300 to the bonded integrated circuit devices is through the first metal layer 322 and the second metal layer 332, the resistance R of the signal path is R=(R1*R2)/R1+R2. The resistance R of the signal path must be lower than R2. If the resistance of the signal path is significantly reduced, the driving ability of the signal path from the FPC board 300 to the bonded integrated circuit device is also significantly improved and increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A layout of a printed circuit board, adaptive to be bonded to an integrated circuit device, the layout comprising:
a first metal layer, disposed in a first insulation layer; and
a second metal layer, disposed in a second insulation layer over the first insulation layer, wherein the first metal layer and the second metal layer are connected to each other through a plurality of contact hole filled with conductive materials and are arranged to be substantially parallel to each other throughout a pad structure region and a line structure region of the printed circuit board, wherein the connected first metal layer and second metal layer are used for a signal path from the printed circuit board to the bonded integrated circuit device, and wherein in the pad structure region, the second metal layer is exposed and an Indium Tin Oxide (ITO) layer is disposed on the second metal layer.

2. The layout of the printed circuit board as claimed in claim 1, wherein the printed circuit board is a flexible printed circuit board.

3. The layout of the printed circuit board as claimed in claim 1, wherein the conductive materials of the contact hole is the same material of the second metal layer.

4. The layout of the printed circuit board as claimed in claim 1, further comprising a gate insulation layer, wherein the first metal layer is disposed on the gate insulation layer.

5. The layout of the printed circuit board as claimed in claim 1, wherein the first insulation layer is an inter-layer dielectric layer.

6. The layout of the printed circuit board as claimed in claim 1, wherein the second insulation layer is a planarization layer.

7. A printed circuit board, comprising a plurality of multi-layered line structures, wherein each multi-layered line structure comprises:
a first metal layer defining a first signal path;
a second metal layer defining a second signal path substantially parallel to the first signal path;
a first insulation layer separating the first metal layer and the second metal layer, the first insulation layer having a plurality of contact holes present along the first signal path and the second signal path, which contact holes are filled with a conductive material interconnecting the first metal layer and the second metal layer, wherein the first signal path and the second signal path form a combined signal path.

8. A printed circuit board as claimed in claim 7, wherein the first metal layer has a first defined width, and the second metal layer has a second defined width, wherein the contact holes are provided within the first defined width and the second defined width.

9. A printed circuit board as claimed in claim 8, wherein the contact holes are provided in the insulation layer along the combined signal path.

10. A flexible printed circuit board, comprising multi-layered line structures of the printed circuit board as claimed in claim 7.

11. A printed circuit board as claimed in claim 7, wherein the printed circuit board is a flexible printed circuit board.

12. A printed circuit board as claimed in claim 7, wherein the conductive material is of same material of at least one of the first metal layer and the second metal layer.

13. A printed circuit board as claimed in claim 7, further comprising a multi-layered pad structure for bonding to an integrated circuit device, wherein the multi-layered pad structure comprises a first metal layer separated from a second metal layer by an insulation layer, with the first metal layer and the second metal layer interconnected by a conductive material via a plurality of contact holes in the insulation layer therebetween.

* * * * *